United States Patent
Hong et al.

(10) Patent No.: US 11,915,783 B2
(45) Date of Patent: Feb. 27, 2024

(54) SEMICONDUCTOR DEVICE RELATED TO OPERATION OF INTERNAL CIRCUITS

(71) Applicant: SK hynix Inc., Icheon-si (KR)

(72) Inventors: Gi Moon Hong, Icheon-si (KR); Dong Yoon Ka, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 94 days.

(21) Appl. No.: 17/695,613

(22) Filed: Mar. 15, 2022

(65) Prior Publication Data
US 2023/0215476 A1 Jul. 6, 2023

(30) Foreign Application Priority Data
Jan. 4, 2022 (KR) .................. 10-2022-0001199

(51) Int. Cl.
  *G11C 7/10* (2006.01)
  *G11C 7/22* (2006.01)
  *G11C 8/10* (2006.01)
(52) U.S. Cl.
  CPC .............. *G11C 7/1069* (2013.01); *G11C 7/22* (2013.01); *G11C 8/10* (2013.01)
(58) Field of Classification Search
  CPC ......... G11C 7/222; G11C 7/08; G11C 7/1009; G11C 7/1012; G11C 7/12; G11C 8/08
  USPC ...................................................... 365/230.03
  See application file for complete search history.

(56) References Cited

U.S. PATENT DOCUMENTS

| 10,339,071 B2 | 7/2019 | Bell et al. |
| 2010/0157714 A1 | 6/2010 | Oh |
| 2020/0294575 A1* | 9/2020 | O .................... G06N 3/04 |

FOREIGN PATENT DOCUMENTS

| KR | 1019990080772 A | 11/1999 |
| KR | 20080043561 A * | 5/2008 |

* cited by examiner

*Primary Examiner* — Huan Hoang
(74) *Attorney, Agent, or Firm* — William Park & Associates Ltd.

(57) ABSTRACT

A semiconductor device includes a memory core circuit configured to generate core data from bank data outputted by a bank or generate the core data from a dummy column address based on a read operation for the bank. The semiconductor device also includes a data control circuit configured to generate a switching signal from a bank active signal or a dummy bank address based on the read operation for the bank and and configured to control the output of the core data based on the switching signal.

27 Claims, 17 Drawing Sheets

SEMICONDUCTOR DEVICE RELATED TO OPERATION OF INTERNAL CIRCUITS

CROSS-REFERENCE TO RELATED APPLICATION

The present application claims priority under 35 U.S.C. § 119(a) to Korean application number 10-2022-0001199, filed in the Korean Intellectual Property Office on Jan. 4, 2022, the entire disclosure of which is incorporated herein by reference.

BACKGROUND

In general, a semiconductor device includes various internal circuits in order to perform an active operation, a read operation, and a write operation. When some of the internal circuits included in the semiconductor device are in a deactivated state for a long time period, PMOS transistors or NMOS transistors included in each of the internal circuits may deteriorate due to an internal node fixed to a specific logic level. If only one of the PMOS transistors and the NMOS transistors included in the internal circuit deteriorates, a phenomenon occurs in which the internal circuit deteriorates due to the distortion of the duty ratios of various internal signals generated by the internal circuit.

SUMMARY

In an embodiment, a semiconductor device may include a memory core circuit configured to generate core data from bank data outputted by a bank or generate the core data from a dummy column address based on a read operation for the bank and a data control circuit configured to generate a switching signal from a bank active signal or a dummy bank address based on the read operation for the bank and control the output of the core data based on the switching signal.

In another embodiment, a semiconductor device may include a first memory core circuit configured to generate core data from first bank data outputted by a first bank or generate the core data from a dummy column address based on a read operation for the first bank, and a second memory core circuit configured to generate the core data from second bank data outputted by a second bank or generate the core data from the dummy column address based on a read operation for the second bank.

In another embodiment, a semiconductor device may include a first data control circuit configured to generate a first switching signal activated to output core data generated from a first bank when a read operation for the first bank is performed, and a second data control circuit configured to generate a second switching signal activated to output the core data generated from a second bank when a read operation for the second bank is performed.

DETAILED DESCRIPTION

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having "logic high level" is distinguished from a signal having "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

A "logic bit set" may mean a combination of logic levels of bits included in a signal. When a logic level of each of the bits included in the signal is changed, a logic bit set of the signal may be differently set. For example, if two bits are included in a signal, a logic bit set of the signal may be set as a first logic bit set when logic levels of the two bits included in the signal are a "logic low level" and a "logic low level", and may be set as a second logic bit set when logic levels of the two bits included in the signal are a "logic low level", and a "logic high level."

Hereafter, the teachings of the present disclosure will be described in more detail through embodiments. The embodiments are only used to exemplify the teachings of the present disclosure, and the scope of the present disclosure is not limited by the embodiments.

Figure 1:
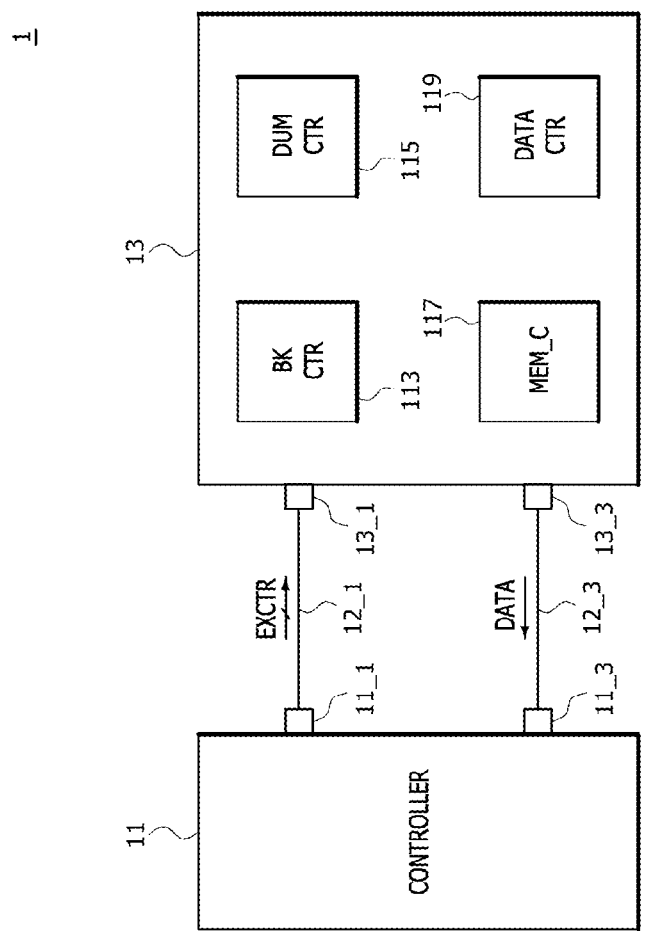
FIG. 1 is a block diagram illustrating a configuration of a semiconductor system according to an example of the present disclosure.

FIG. 1 is a block diagram illustrating a configuration of a semiconductor system 1 according to an example of the present disclosure. As illustrated in FIG. 1, the semiconductor system 1 may include a controller 11 and a semiconductor device 13.

The controller 11 may include a first control pin 11_1 and a second control pin 11_3. The semiconductor device 13 may include a first device pin 13_1 and a second device pin 13_3. The controller 11 may transmit an external control signal EXCTR to the semiconductor device 13 through a first transmission line 12_1 coupled between the first control pin 11_1 and the first device pin 13_1. In this example, the external control signal EXCTR may include a command and an address, but this is merely an example and the present disclosure is not limited thereto. Each of the first control pin 11_1, the first transmission line 12_1, and the first device pin 13_1 may be implemented in plural depending on the number of bits of the external control signal EXCTR. The controller 11 may receive transmission data DATA through a second transmission line 12_3 coupled between the second control pin 11_3 and the second device pin 13_3.

The semiconductor device 13 may include a bank control circuit (BK CTR) 113 configured to generate a bank active signal (BK_ACT in FIG. 2) based on a bank address (BA in FIG. 2) when a column operation is performed and a column command (CCMD in FIG. 2) is generated. The semiconductor device 13 may include the bank control circuit 113 configured to generate a bank strobe (BK_STB in FIG. 2) for controlling a data output operation of each of banks (147 and 157 in FIG. 6), for example, memory banks, based on the bank address (BA in FIG. 2), a column strobe (CSTB in FIG. 3), and a dummy column strobe D_CSTB. The semiconductor device 13 may include a dummy control circuit (DUM CTR) 115 configured to generate the dummy column strobe (D_CSTB in FIG. 2) including pulses generated every preset strobe cycle interval, generate a dummy column address (D_CA in FIG. 2) whose logic bit set is changed every strobe cycle interval by counting pulses of the dummy column strobe (D_CSTB in FIG. 2), and generate a dummy bank address D_BA whose logic bit set is changed whenever a logic level of the most significant bit (MSB) of the dummy column address (D_CA in FIG. 2) transitions. The semiconductor device 13 may include a memory core circuit (MEM_C) 117 capable of toggling each of logic levels of internal nodes included in each of internal circuits (141, 143, 149, 151, 153, and 159 in FIG. 6) based on the dummy column address D_CA when a column operation for a first bank (147 in FIG. 6) and a second bank (157 in FIG. 6) is not performed, thereby preventing the internal circuits (141, 143, 149, 151, 153, and 159 in FIG. 6) from deteriorating. The semiconductor device 13 may include a data control circuit (DATA CTR) 119 capable of toggling each of logic levels of internal nodes included in each of internal circuits (161, 163, 165, 167, 169, 181, 183, 185, 187, and 189 in FIG. 7) based on the dummy bank address D_BA when a column operation for the first bank (147 in FIG. 6) and the second bank (157 in FIG. 6) is not performed, thereby preventing the internal circuits (161, 163, 165, 167, 169, 181, 183, 185, 187, and 189 in FIG. 7) from deteriorating.

Figure 2:
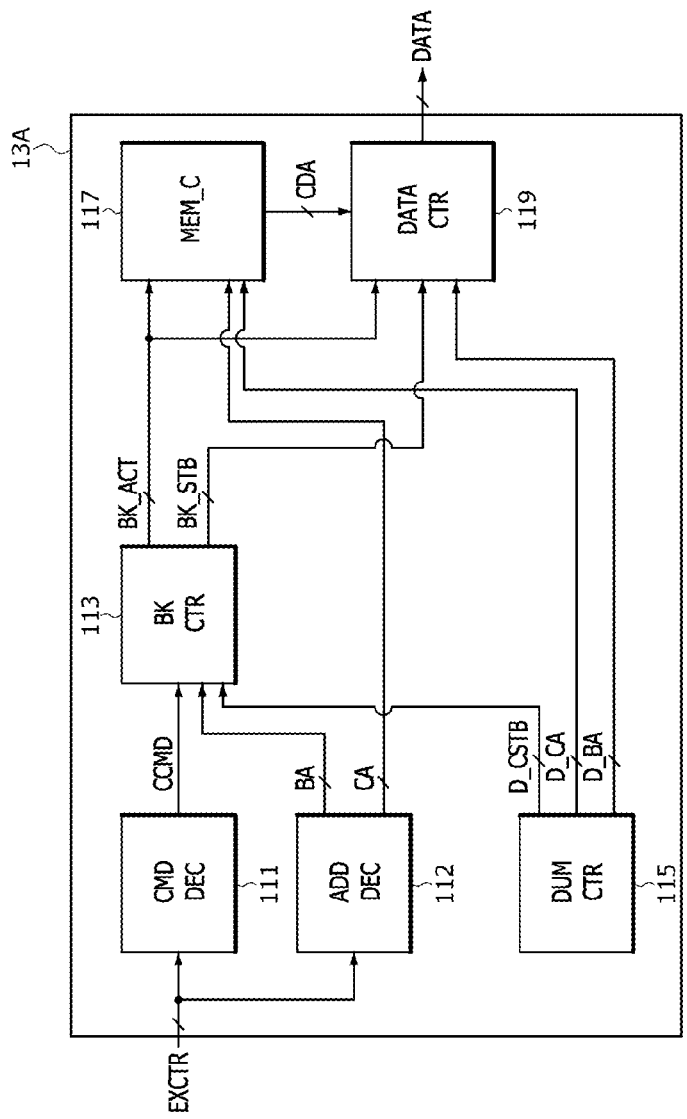
FIG. 2 is a block diagram illustrating a configuration of a semiconductor device according to an example of the present disclosure.

FIG. 2 is a block diagram illustrating a configuration of a semiconductor device 13A according to an example of the present disclosure. As illustrated in FIG. 2, the semiconductor device 13A may include a command decoder (CMD DEC) 111, an address decoder (ADD DEC) 112, the bank control circuit (BK CTR) 113, the dummy control circuit (DUM CTR) 115, the memory core circuit (MEM_C) 117, and the data control circuit (DATA CTR) 119.

The command decoder 111 may generate the column command CCMD based on the external control signal EXCTR. The command decoder 111 may generate the column command CCMD for a column operation by decoding the external control signal EXCTR. The column operation may include a read operation. The column command CCMD may include a read command generated for the read operation.

The address decoder 112 may generate the bank address BA and a column address CA based on the external control signal EXCTR. The command decoder 111 may generate the bank address BA and the column address CA by decoding the external control signal EXCTR. The bank address BA may be set to have a logic bit set for selecting one of the banks (147 and 157 in FIG. 6) included in the memory core circuit 117. For example, the bank address BA may be set to have a first logic bit set for selecting the first bank 147, and may be set to have a second logic bit set for selecting the second bank 157. The column address CA may be set to have a logic bit set for selecting one of column lines respectively included in a bank selected by the bank address BA. For example, the column address CA may be set to have a first logic bit set for selecting a first column line (not illustrated), and may be set to have a second logic bit set for selecting a second column line (not illustrated). The column line (not illustrated) may be one of a bit line (not illustrated) to which a memory cell array included in a bank is coupled and an input and output line (not illustrated) coupled to a bit line. The number of bits of the bank address BA may be determined depending on the number of banks included in the memory core circuit 117. The number of bits of the column address CA may be determined depending on the number of column lines included in the memory core circuit 117.

The bank control circuit 113 may be coupled to the command decoder 111, the address decoder 112, the dummy control circuit 115, the memory core circuit 117, and the data control circuit 119. The bank control circuit 113 may receive the column command CCMD from the command decoder 111. The bank control circuit 113 may receive the bank address BA from the address decoder 112. The bank control circuit 113 may receive the dummy column strobe D_CSTB from the dummy control circuit 115. The bank control circuit 113 may generate the bank active signal BK_ACT and the bank strobe BK_STB based on the column command CCMD, the bank address BA, and the dummy column strobe D_CSTB.

The bank control circuit 113 may generate the bank active signal BK_ACT based on the bank address BA when a column operation is performed and the column command CCMD is generated. For example, the bank control circuit 113 may activate a first bit BK_ACT<1> of the bank active signal BK_ACT when the column command CCMD for a column operation is generated in the state in which the bank address BA having a first logic bit set is received in order to select the first bank (147 in FIG. 6). Furthermore, for example, the bank control circuit 113 may activate a second bit BK_ACT<2> of the bank active signal BK_ACT when the column command CCMD for a column operation is generated in the state in which the bank address BA having a second logic bit set is received in order to select the second bank (157 in FIG. 6). Furthermore, for example, the bank control circuit 113 may deactivate the first bit BK_ACT<1> of the bank active signal BK_ACT and the second bit BK_ACT<2> of the bank active signal BK_ACT when a column operation for the first bank (147 in FIG. 6) and the second bank (157 in FIG. 6) is not performed and the column command CCMD is not generated.

The bank control circuit 113 may generate the column strobe (CSTB in FIG. 3) when a column operation is performed and the column command CCMD is generated. The bank control circuit 113 may generate the bank strobe BK_STB for controlling a data output operation of each of the first bank (147 in FIG. 6) and the second bank (157 in FIG. 6) based on the bank address BA, the column strobe (CSTB in FIG. 3), and the dummy column strobe D_CSTB. For example, the bank control circuit 113 may activate a first bit BK_STB<1> of the bank strobe BK_STB in order to control a data output operation for the first bank (147 in FIG. 6) based on the column strobe (CSTB in FIG. 3) when the column command CCMD for a column operation is generated in the state in which the bank address BA having a first logic bit set is received in order to select the first bank (147 in FIG. 6). Furthermore, for example, the bank control circuit 113 may activate a second bit BK_STB<2> of the bank strobe BK_STB in order to control a data output operation for the second bank (157 in FIG. 6) based on the column strobe (CSTB in FIG. 3) when the column command CCMD for a column operation is generated in the state in which the bank address BA having a second logic bit set is received in order to select the second bank (157 in FIG. 6). Furthermore, for example, the bank control circuit 113 may deactivate the first bit BK_STB<1> of the bank strobe BK_STB and the second bit BK_STB<2> of the bank strobe BK_STB in order to control a data output operation for the first bank (147 in FIG. 6) and the second bank (157 in FIG. 6) in response to the dummy column strobe D_CSTB when a column operation for the first bank (147 in FIG. 6) and the second bank (157 in FIG. 6) is not performed and the column command CCMD is not generated.

The dummy control circuit 115 may generate the dummy column strobe D_CSTB including pulses generated every preset strobe cycle interval. The dummy control circuit 115 may generate the dummy column address D_CA based on the dummy column strobe D_CSTB. The dummy control circuit 115 may generate the dummy column address D_CA whose logic bit set is changed every strobe cycle interval by counting a pulse of the dummy column strobe D_CSTB. For example, the dummy control circuit 115 may cyclically increase the dummy column address D_CA, set as a binary number of 6 bits, from "000000" to "111111" by one bit whenever a pulse of the dummy column strobe D_CSTB is generated. The dummy control circuit 115 may generate the dummy bank address D_BA based on the dummy column address D_CA. The dummy control circuit 115 may generate the dummy bank address D_BA whose logic bit set is changed whenever a logic level of the MSB of the dummy column address D_CA transitions. For example, the dummy control circuit 115 may cyclically increase the dummy bank address D_BA, set as a binary number of 2 bits, from "00" to "11" by one bit whenever a logic bit set of the dummy column address D_CA set as a binary number of 6 bits changes from "111111" to "000000." The dummy control circuit 115 may be coupled to the bank control circuit 113, the memory core circuit 117, and the data control circuit 119. The dummy control circuit 115 may apply the dummy column strobe D_CSTB to the bank control circuit 113. The dummy control circuit 115 may apply the dummy column address D_CA to the memory core circuit 117. The dummy control circuit 115 may apply the dummy bank address D_BA to the data control circuit 119.

The memory core circuit 117 may be coupled to the address decoder 112, the bank control circuit 113, the dummy control circuit 115, and the data control circuit 119. The memory core circuit 117 may receive the column address CA from the address decoder 112, may receive the bank active signal BK_ACT from the bank control circuit 113, and may receive the dummy column address D_CA from the dummy control circuit 115. The memory core circuit 117 may generate core data CDA based on the bank active signal BK_ACT, the column address CA, and the dummy column address D_CA, and may output the core data CDA. For example, the memory core circuit 117 may generate the core data CDA from the first bank (147 in FIG. 6) based on the column address CA and output the core data CDA, when a read operation for the first bank (147 in FIG. 6) is performed and the first bit BK_ACT<1> of the bank active signal BK_ACT is activated. Furthermore, for example, the memory core circuit 117 may generate the core data CDA from the second bank (157 in FIG. 6) based on the column address CA and output the core data CDA, when a read operation for the second bank (157 in FIG. 6) is performed and the second bit BK_ACT<2> of the bank active signal BK_ACT is activated. Furthermore, for example, the memory core circuit 117 may generate the core data CDA from the dummy column address D_CA and output the core data CDA, when a read operation for the first bank (147 in FIG. 6) and the second bank (157 in FIG. 6) is not performed and the first bit BK_ACT<1> of the bank active signal BK_ACT and the second bit BK_ACT<2> of the bank active signal BK_ACT are deactivated. Furthermore, for example, the memory core circuit 117 may toggle each of logic levels of internal nodes respectively included in the internal circuits (141, 143, 149, 151, 153, and 159 in FIG. 6) in response to the dummy column address D_CA when a read operation for the first bank (147 in FIG. 6) and the second bank (157 in FIG. 6) is not performed, thereby preventing the internal circuits (141, 143, 149, 151, 153, and 159 in FIG. 6) from deteriorating. The memory core circuit 117 may apply the core data CDA to the data control circuit 119.

The data control circuit 119 may be coupled to the bank control circuit 113, the dummy control circuit 115, and the memory core circuit 117. The data control circuit 119 may receive the bank active signal BK_ACT and the bank strobe BK_STB from the bank control circuit 113, may receive the dummy bank address D_BA from the dummy control circuit 115, and may receive the core data CDA from the memory core circuit 117. The data control circuit 119 may output the core data CDA as the transmission data DATA through a data pad (190 in FIG. 7) based on the bank active signal BK_ACT, the bank strobe BK_STB, and the dummy bank address D_BA. For example, the data control circuit 119 may output a first bit (CDA<1> in FIG. 7) of the core data CDA, generated from the first bank (147 in FIG. 6), as the transmission data DATA in synchronization with the first bit BK_STB<1> of the bank strobe BK_STB when a read operation for the first bank (147 in FIG. 6) is performed and the first bit (BK_ACT<1> in FIG. 7) of the bank active signal BK_ACT is activated. Furthermore, for example, the data control circuit 119 may output a second bit (CDA<2> in FIG. 7) of the core data CDA, generated from the second bank (157 in FIG. 6), as the transmission data DATA in synchronization with the second bit BK_STB<2> of the bank strobe BK_STB when a read operation for the second bank (157 in FIG. 6) is performed and the second bit (BK_ACT<2> in FIG. 7) of the bank active signal BK_ACT is activated. Furthermore, for example, the data control circuit 119 may output the core data CDA as the transmission data DATA based on the dummy bank address D_BA and the bank strobe BK_STB when a read operation for the first bank (147 in FIG. 6) and the second bank (157 in FIG. 6) is not performed and the first bit (BK_ACT<1> in FIG. 7) of the bank active signal BK_ACT and the second bit (BK_ACT<2> in FIG. 7) of the bank active signal BK_ACT are deactivated. The data control circuit 119 may toggle each of logic levels of internal nodes respectively included in the internal circuits (161, 163, 165, 167, 169, 181, 183, 185, 187, and 189 in FIG. 7) based on the dummy bank address D_BA when a read operation for the first bank (147 in FIG. 6) and the second bank (157 in FIG. 6) is not performed, thereby preventing the internal circuits (161, 163, 165, 167, 169, 181, 183, 185, 187, and 189 in FIG. 7) from deteriorating.

Figure 3:
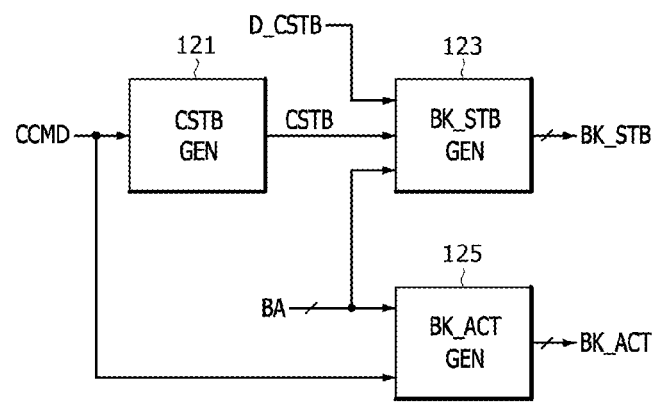
FIG. 3 is a block diagram illustrating a configuration of a bank control circuit according to an example of the present disclosure.

FIG. 3 is a block diagram illustrating a configuration of a bank control circuit 113A according to an example of the present disclosure. As illustrated in FIG. 3, the bank control circuit 113A may include a column strobe generation circuit (CSTB GEN) 121, a bank strobe generation circuit (BK_STB GEN) 123, and a bank active signal generation circuit (BK_ACT GEN) 125.

The column strobe generation circuit 121 may generate the column strobe CSTB when a column operation is performed and the column command CCMD is generated. For example, the column strobe generation circuit 121 may generate the column strobe CSTB when a column operation for the first bank (147 in FIG. 6) or the second bank (157 in FIG. 6) is performed. The column strobe generation circuit 121 may be coupled to the bank strobe generation circuit 123, and may apply the column strobe CSTB to the bank strobe generation circuit 123.

The bank strobe generation circuit 123 may be coupled to the column strobe generation circuit 121, and may receive the column strobe CSTB from the column strobe generation circuit 121. The bank strobe generation circuit 123 may generate the bank strobe BK_STB based on the bank address BA, the column strobe CSTB, and the dummy column strobe D_CSTB. For example, the bank strobe generation circuit 123 may activate the first bit BK_STB<1> of the bank strobe BK_STB in order to control a data output operation for the first bank (147 in FIG. 6) in response to the column strobe CSTB, when the column command CCMD for a column operation is generated in the state in which the bank address BA having a first logic bit set is received in order to select the first bank (147 in FIG. 6). Furthermore, for example, the bank strobe generation circuit 123 may activate the second bit BK_STB<2> of the bank strobe BK_STB in order to control a data output operation for the second bank (157 in FIG. 6) in response to the column strobe CSTB, when the column command CCMD for a column operation is generated in the state in which the bank address BA having a second logic bit set is received in order to select the second bank (157 in FIG. 6). Furthermore, for example, the bank strobe generation circuit 123 may deactivate the first bit BK_STB<1> of the bank strobe BK_STB and the second bit BK_STB<2> of the bank strobe BK_STB in order to control a data output operation for the first bank (147 in FIG. 6) and the second bank (157 in FIG. 6) in response to the dummy column strobe D_CSTB, when a column operation for the first bank (147 in FIG. 6) and the second bank (157 in FIG. 6) is not performed and the column command CCMD is not generated.

The bank active signal generation circuit 125 may generate the bank active signal BK_ACT based on the bank address BA when a column operation is performed and the column command CCMD is generated. For example, the bank active signal generation circuit 125 may activate the first bit BK_ACT<1> of the bank active signal BK_ACT when the column command CCMD for a column operation is generated in the state in which the bank address BA having a first logic bit set is received in order to select the first bank (147 in FIG. 6). Furthermore, for example, the bank active signal generation circuit 125 may activate the second bit BK_ACT<2> of the bank active signal BK_ACT when the column command CCMD for a column operation is generated in the state in which the bank address BA having a second logic bit set is received in order to select the second bank (157 in FIG. 6). Furthermore, for example, the bank active signal generation circuit 125 may deactivate the first bit BK_ACT<1> of the bank active signal BK_ACT and the second bit BK_ACT<2> of the bank active signal BK_ACT when a column operation for the first bank (147 in FIG. 6) and the second bank (157 in FIG. 6) is not performed and the column command CCMD is not generated.

Figure 4:
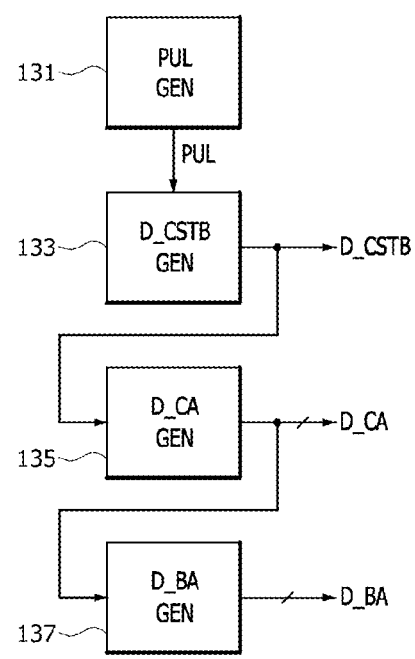
FIG. 4 is a block diagram illustrating a configuration of a dummy control circuit according to an example of the present disclosure.

FIG. 4 is a block diagram illustrating a configuration of a dummy control circuit 115A according to an example of the present disclosure. As illustrated in FIG. 4, the dummy control circuit 115A may include a pulse generation circuit (PUL GEN) 131, a dummy column strobe generation circuit (D_CSTB GEN) 133, a dummy column address generation circuit (D_CA GEN) 135, and a dummy bank address generation circuit (D_BA GEN) 137.

The pulse generation circuit 131 may generate a pulse signal PUL including pulses generated every preset oscillation period interval. The pulse generation circuit 131 may be implemented as an oscillator. The oscillation period may be set in various ways in different embodiments. The pulse generation circuit 131 may be coupled to the dummy column strobe generation circuit 133, and may apply the pulse signal PUL to the dummy column strobe generation circuit 133.

The dummy column strobe generation circuit 133 may be coupled to the pulse generation circuit 131 and the dummy column address generation circuit 135. The dummy column strobe generation circuit 133 may receive the pulse signal PUL from the pulse generation circuit 131. The dummy column strobe generation circuit 133 may generate the dummy column strobe D_CSTB, including pulses generated every preset strobe cycle interval, based on the pulse signal PUL. For example, the dummy column strobe generation circuit 133 may be implemented as a division circuit for generating the dummy column strobe D_CSTB by dividing the pulse signal PUL. Furthermore, for example, the dummy column strobe generation circuit 133 may be implemented as a counting circuit for generating the dummy column strobe D_CSTB whose logic level transitions, whenever a pulse included in the pulse signal PUL is counted. A strobe cycle interval may be set to be twice greater than an oscillation period interval, but this is merely an embodiment and the present disclosure is not limited thereto. The dummy column strobe generation circuit 133 may apply the dummy column strobe D_CSTB to the dummy column address generation circuit 135.

The dummy column address generation circuit 135 may be coupled to the dummy column strobe generation circuit 133 and the dummy bank address generation circuit 137. The dummy column address generation circuit 135 may receive the dummy column strobe D_CSTB from the dummy column address generation circuit 135. The dummy column address generation circuit 135 may generate the dummy column address D_CA based on the dummy column strobe D_CSTB. The dummy column address generation circuit 135 may generate the dummy column address D_CA whose logic bit set is changed every strobe cycle interval by counting a pulse of the dummy column strobe D_CSTB. For example, the dummy control circuit 115A may cyclically increase the dummy column address D_CA, set as a binary number of 6 bits, from "000000" to "111111" by one bit whenever a pulse of the dummy column strobe D_CSTB is generated.

The dummy bank address generation circuit 137 may be coupled to the dummy column address generation circuit 135, and may receive the dummy column address D_CA from the dummy column address generation circuit 135. The dummy bank address generation circuit 137 may generate the dummy bank address D_BA based on the dummy column address D_CA. The dummy bank address generation circuit 137 may generate the dummy bank address D_BA whose logic bit set is changed whenever a logic level of the MSB of the dummy column address D_CA transitions. For example, the dummy bank address generation circuit 137 may cyclically increase the dummy bank address D_BA, set as a binary number of 2 bits, from "00" to "11" by one bit whenever a logic bit set of the dummy column address D_CA set as a binary number of 6 bits is changed from "111111" to "000000."

Figure 5:
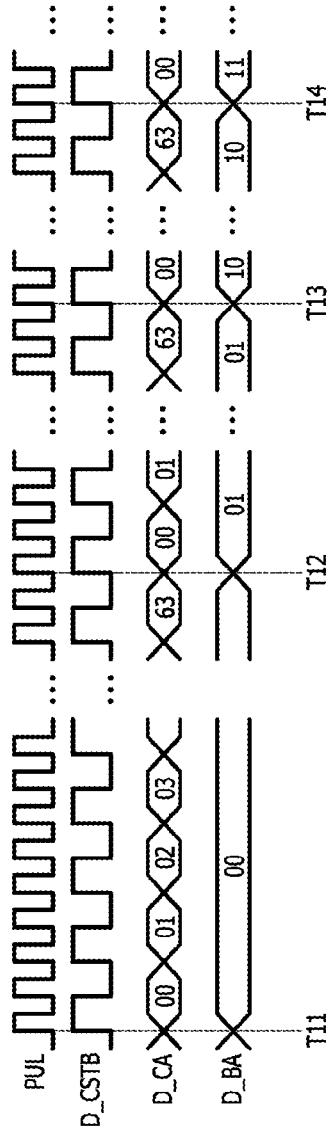
FIG. 5 is a timing diagram for describing an operation of a dummy control circuit according to an example of the present disclosure.

FIG. 5 is a timing diagram for describing an operation of the dummy control circuit 115A according to an example of the present disclosure.

As illustrated in FIG. 5, the dummy column strobe D_CSTB including pulses generated every preset strobe cycle interval may be generated from the pulse signal PUL including pulses generated every preset oscillation period interval. A logic bit set of the dummy column address D_CA may be changed every strobe cycle interval by counting a pulse of the dummy column strobe D_CSTB. When the first pulse of the dummy column strobe D_CSTB is generated, the dummy column address D_CA set as a binary number of 6 bits may be set to "000000" (corresponding to a decimal number "00"). When a $64^{th}$ pulse of the dummy column strobe D_CSTB is generated, the dummy column address D_CA may be set to "111111" (corresponding to a decimal number "63"). When a $65^{th}$ pulse of the dummy column strobe D_CSTB is generated, the dummy column address D_CA may be set to 000000" (corresponding to a decimal number "00"). A logic bit set of the dummy bank address D_BA may be changed whenever a logic level of the MSB of the dummy column address D_CA transitions from a logic high level "1" to a logic low level "0." The dummy bank address D_BA set as a binary number of 2 bits may be cyclically increased from "00" to "11" by one bit whenever a logic bit set of the dummy column address D_CA set as a binary number of 6 bits is changed from "111111" to "000000." In an interval T11 to T12, a logic bit set of the dummy column address D_CA is changed from "000000" to "111111." At timing T12, the dummy bank address D_BA is changed from "00" to "01" because a logic bit set of the dummy column address D_CA is changed from "111111" to "000000." Furthermore, in an interval T12 to T13, a logic bit set of the dummy column address D_CA is changed from "000000" to "111111." At timing T13, the dummy bank address D_BA is changed from "01" to "10" because a logic bit set of the dummy column address D_CA is changed from "111111" to "000000." Likewise, in an interval T13 to T14, a logic bit set of the dummy column address D_CA is changed from "000000" to "111111." At timing T14, the dummy bank address D_BA is changed from "10" to "11" because a logic bit set of the dummy column address D_CA is changed from "111111" to "000000."

Figure 6:
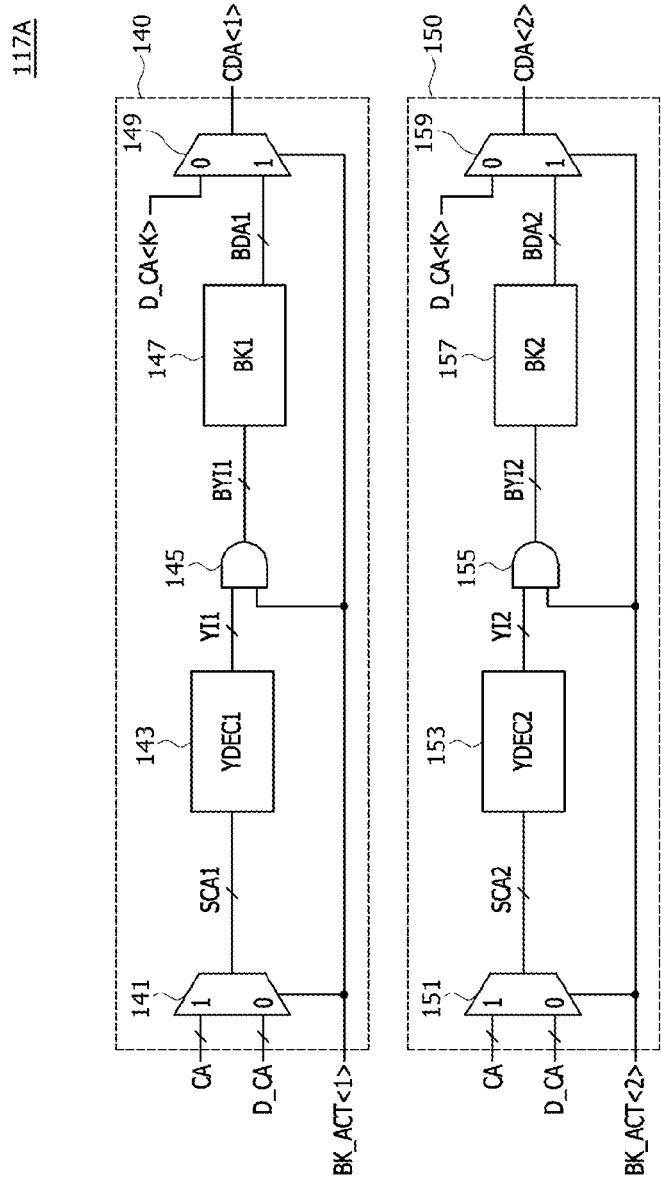
FIG. 6 is a block diagram illustrating a configuration of a memory core circuit according to an example of the present disclosure.

FIG. 6 is a block diagram illustrating a configuration of a memory core circuit 117A according to an example of the present disclosure. As illustrated in FIG. 6, the memory core circuit 117A may include a first memory core circuit 140 and a second memory core circuit 150. The first memory core circuit 140 may include a first input selector 141, a first column decoder (YDEC1) 143, a first bank column control circuit 145, a first bank (BK1) 147, and a first output selector 149. The second memory core circuit 150 may include a second input selector 151, a second column decoder (YDEC2) 153, a second bank column control circuit 155, a second bank (BK2) 157, and a second output selector 159.

For the first memory core circuit 140, the first input selector 141 may generate a first selection column address SCA1 from the column address CA and the dummy column address D_CA based on the first bit BK_ACT<1> of the bank active signal BK_ACT. The first input selector 141 may select the column address CA as the first selection column address SCA1 and output the first selection column address SCA1, when a read operation for the first bank 147 is performed and the first bit BK_ACT<1> of the bank active signal BK_ACT is activated to a logic high level "1." The first input selector 141 may select the dummy column address D_CA as the first selection column address SCA1 and output the first selection column address SCA1, when a read operation for the first bank 147 is not performed and the first bit BK_ACT<1> of the bank active signal BK_ACT is deactivated to a logic low level "0." The first input selector 141 may be coupled to the first column decoder 143, and may apply the first selection column address SCA1 to the first column decoder 143.

The first column decoder 143 may be coupled to the first input selector 141, and may receive the first selection column address SCA1 from the first input selector 141. The first column decoder 143 may generate a first column selection signal YI1 for selecting at least one of column lines (not illustrated) included in the first bank 147 by decoding the first selection column address SCA1. For example, the first column decoder 143 may activate a bit corresponding to a first column line (not illustrated) included in the first bank 147, among bits included in the first column selection signal YI1, in order to select the first column line (not illustrated) by decoding the first selection column address SCA1. Furthermore, for example, the first column decoder 143 may activate a bit corresponding to a second column line (not illustrated) included in the first bank 147, among bits included in the first column selection signal YI1, in order to select the second column line (not illustrated) by decoding the first selection column address SCA1. The first column decoder 143 may be coupled to the first bank column control circuit 145, and may apply the first column selection signal YI1 to the first bank column control circuit 145.

The first bank column control circuit 145 may be coupled to the first column decoder 143, and may receive the first column selection signal YI1 from the first column decoder 143. The first bank column control circuit 145 may generate a first bank column selection signal BY11 from the first column selection signal YI1 based on the first bit BK_ACT<1> of the bank active signal BK_ACT. The first bank column control circuit 145 may generate the first bank column selection signal BY11 by buffering the first column selection signal YI1 when a read operation for the first bank 147 is performed and the first bit BK_ACT<1> of the bank active signal BK_ACT is activated to a logic high level. The first bank column control circuit 145 may deactivate the first bank column selection signal BY11 when a read operation for the first bank 147 is not performed and the first bit BK_ACT<1> of the bank active signal BK_ACT is deactivated to a logic low level. The first bank column control circuit 145 may be coupled to the first bank 147, and may apply the first bank column selection signal BY11 to the first bank 147.

The first bank 147 may be coupled to the first bank column control circuit 145, and may receive the first bank column selection signal BY11 from the first bank column control circuit 145. The first bank 147 may output first bank data BDA1 stored in a memory cell array (not illustrated) coupled to a column line (not illustrated) selected based on the first bank column selection signal BY11. The first bank 147 may be coupled to the first output selector 149, and may apply the first bank data BDA1 to the first output selector 149.

The first output selector 149 may be coupled to the first bank 147, and may receive the first bank data BDA1 from the first bank 147. The first output selector 149 may generate the first bit CDA<1> of the core data CDA from the first bank data BDA1 and K-th bit D_CA<K> of the dummy column address D_CA based on the first bit BK_ACT<1> of the bank active signal BK_ACT. The first output selector 149 may select the first bank data BDA1 as the first bit CDA<1> of the core data CDA and output the first bit CDA<1>, when a read operation for the first bank 147 is performed and the first bit BK_ACT<1> of the bank active signal BK_ACT is activated to a logic high level "1." The first output selector 149 may select the K-th bit D_CA<K> of the dummy column address D_CA as the first bit CDA<1> of the core data CDA and output the K-th bit D_CA<K>, when a read operation for the first bank 147 is not performed and the first bit BK_ACT<1> of the bank active signal BK_ACT is deactivated to a logic low level "0." The K-th bit D_CA<K> of the dummy column address D_CA may be set as the MSB among bits included in the dummy column address D_CA, but this is merely an embodiment and the present disclosure is not limited thereto.

For the second memory core circuit 150, the second input selector 151 may generate a second selection column address SCA2 from the column address CA and the dummy column address D_CA based on the second bit BK_ACT<2> of the bank active signal BK_ACT. The second input selector 151 may select the column address CA as the second selection column address SCA2 and output the second selection column address SCA2, when a read operation for the second bank 157 is performed and the second bit BK_ACT<2> of the bank active signal BK_ACT is activated to a logic high level "1." The second input selector 151 may select the dummy column address D_CA as the second selection column address SCA2 and output the second selection column address SCA2, when a read operation for the second bank 157 is not performed and the second bit BK_ACT<2> of the bank active signal BK_ACT is deactivated to a logic low level "0." The second input selector 151 may be coupled to the second column decoder 153, and may apply the second selection column address SCA2 to the second column decoder 153.

The second column decoder 153 may be coupled to the second input selector 151, and may receive the second selection column address SCA2 from the second input selector 151. The second column decoder 153 may generate a second column selection signal YI2 for selecting at least one of column lines (not illustrated) included in the second bank 157 by decoding the second selection column address SCA2. For example, the second column decoder 153 may activate a bit corresponding to a first column line (not illustrated) included in the second bank 157, among bits included in the second column selection signal YI2, in order to select the first column line (not illustrated) by decoding the second selection column address SCA2. Furthermore, for example, the second column decoder 153 may activate a bit corresponding to a second column line (not illustrated) included in the second bank 157, among bits included in the second column selection signal YI2, in order to select the second column line (not illustrated) by decoding the second selection column address SCA2 having a second logic bit set. The second column decoder 153 may be coupled to the second bank column control circuit 155, and may apply the second column selection signal YI2 to the second bank column control circuit 155.

The second bank column control circuit 155 may be coupled to the second column decoder 153, and may receive the second column selection signal YI2 from the second column decoder 153. The second bank column control circuit 155 may generate a second bank column selection signal BYI2 from the second column selection signal YI2 based on the second bit BK_ACT<2> of the bank active signal BK_ACT. The second bank column control circuit 155 may generate the second bank column selection signal BYI2 by buffering the second column selection signal YI2 when a read operation for the second bank 157 is performed and the second bit BK_ACT<2> of the bank active signal BK_ACT is activated to a logic high level. The second bank column control circuit 155 may deactivate the second bank column selection signal BYI2 when a read operation for the second bank 157 is not performed and the second bit BK_ACT<2> of the bank active signal BK_ACT is deactivated to a logic low level. The second bank column control circuit 155 may be coupled to the second bank 157, and may apply the second bank column selection signal BYI2 to the second bank 157.

The second bank 157 may be coupled to the second bank column control circuit 155, and may receive the second bank column selection signal BYI2 from the second bank column control circuit 155. The second bank 157 may output second bank data BDA2 stored in a memory cell array (not illustrated) coupled to a column line (not illustrated) selected based on the second bank column selection signal BYI2. The second bank 157 may be coupled to the second output selector 159, and may apply the second bank data BDA2 to the second output selector 159.

The second output selector 159 may be coupled to the second bank 157, and may receive the second bank data BDA2 from the second bank 157. The second output selector 159 may generate a second bit CDA<2> of the core data CDA from the second bank data BDA2 and the K-th bit D_CA<K> of the dummy column address D_CA based on the second bit BK_ACT<2> of the bank active signal BK_ACT. The second output selector 159 may select the second bank data BDA2 as the second bit CDA<2> of the core data CDA and output the second bit CDA<2>, when a read operation for the second bank 157 is performed and the second bit BK_ACT<2> of the bank active signal BK_ACT is activated to a logic high level "1." The second output selector 159 may select the K-th bit D_CA<K> of the dummy column address D_CA as the second bit CDA<2> of the core data CDA and output the second bit CDA<2>, when a read operation for the second bank 157 is not performed and the second bit BK_ACT<2> of the bank active signal BK_ACT is deactivated to a logic low level "0."

Figure 7:
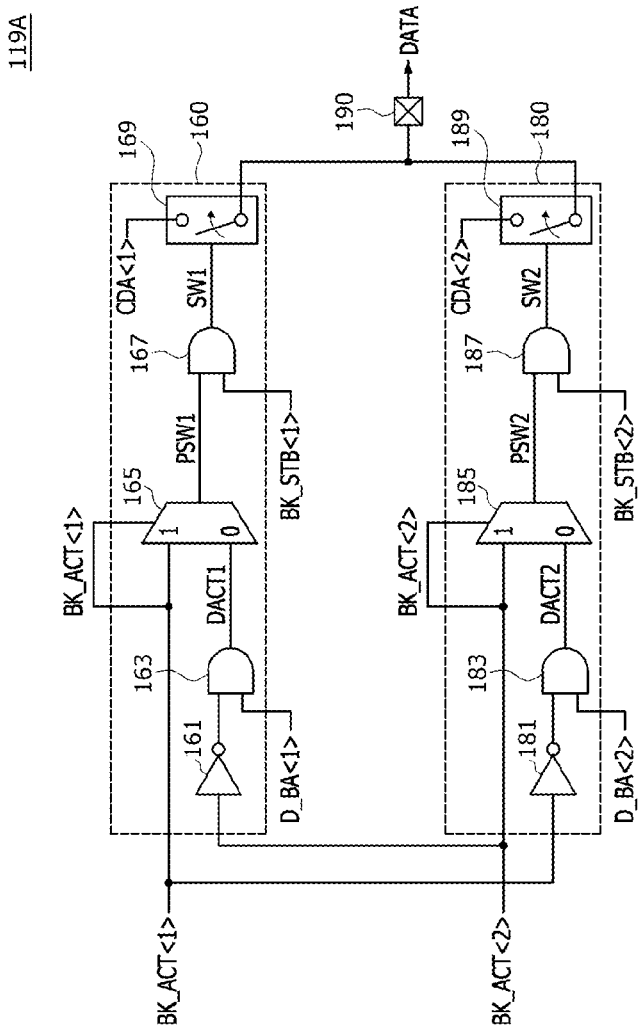
FIG. 7 is a block diagram illustrating a configuration of a data control circuit according to an example of the present disclosure.

FIG. 7 is a block diagram illustrating a configuration of a data control circuit 119A according to an example of the present disclosure. As illustrated in FIG. 7, the data control circuit 119A may include a first data control circuit 160, a second data control circuit 180, and the data pad 190.

The first data control circuit 160 may include an inverter 161, an AND gate 163, a first pre-switching signal selector 165, a first switching signal generator 167, and a first switch 169. The inverter 161 may invert and buffer the second bit BK_ACT<2> of the bank active signal BK_ACT. The AND gate 163 may receive the output signal of the inverter 161 and a first bit D_BA<1> of the dummy bank address D_BA, and may generate a first dummy active signal DACT1 by performing an AND operation on the output signal of the inverter 161 and the first bit D_BA<1>. The first dummy active signal DACT1 may be deactivated when the second bit BK_ACT<2> of the bank active signal BK_ACT is activated. The first dummy active signal DACT1 may be activated in response to the first bit D_BA<1> of the dummy bank address D_BA in the state in which the second bit BK_ACT<2> of the bank active signal BK_ACT has been deactivated. The first pre-switching signal selector 165 may generate a first pre-switching signal PSW1 from the first bit BK_ACT<1> of the bank active signal BK_ACT and the first dummy active signal DACT1 based on the first bit BK_ACT<1> of the bank active signal BK_ACT. The first pre-switching signal selector 165 may output the first bit BK_ACT<1> of the bank active signal BK_ACT as the first pre-switching signal PSW1 when the first bit BK_ACT<1> of the bank active signal BK_ACT has a logic high level "1." The first pre-switching signal selector 165 may output the first dummy active signal DACT1 as the first pre-switching signal PSW1 when the first bit BK_ACT<1> of the bank active signal BK_ACT has a logic low level "0." The first switching signal generator 167 may generate a first switching signal SW1 from the first pre-switching signal PSW1 based on the first bit BK_STB<1> of the bank strobe BK_STB. The first switching signal generator 167 may generate the first switching signal SW1 by buffering the first pre-switching signal PSW1 when the first bit BK_STB<1> of the bank strobe BK_STB is activated. The first switch 169 may control the output of the first bit CDA<1> of the core data CDA based on the first switching signal SW1. The first switch 169 may be turned on when the first switching signal SW1 is activated, and may output the first bit CDA<1> of the core data CDA as the transmission data DATA through the data pad 190.

The first data control circuit 160 may generate the first pre-switching signal PSW1 and the first switching signal SW1 each activated to a logic high level in response to the first bit BK_ACT<1> of the bank active signal BK_ACT, when a read operation for the first bank (147 in FIG. 6) is performed and the first bit BK_ACT<1> of the bank active signal BK_ACT is activated to a logic high level, and may output the first bit CDA<1> of the core data CDA as the transmission data DATA through the data pad 190. The first data control circuit 160 may generate the first pre-switching signal PSW1 and the first switching signal SW1 each deactivated to a logic low level in response to the first dummy active signal DACT1 deactivated to a logic low level when a read operation for the second bank (157 in FIG. 6) is performed and the second bit BK_ACT<2> of the bank active signal BK_ACT is activated to a logic high level, and may block the first bit CDA<1> of the core data CDA from being outputted through the data pad 190. The first data control circuit 160 may generate the first dummy active signal DACT1, the first pre-switching signal PSW1 and the first switching signal SW1 each activated to a logic high level whenever the first bit D_BA<1> of the dummy bank address D_BA is generated as a logic high level, in the state in which the first and second bits BK_ACT<1:2> of the bank active signal BK_ACT have been deactivated to a logic low level because a read operation for the first bank (147 in FIG. 6) or the second bank (157 in FIG. 6) is not performed, and may output the first bit CDA<1> of the core data CDA as the transmission data DATA through the data pad 190.

The second data control circuit 180 may include an inverter 181, an AND gate 183, a second pre-switching signal selector 185, a second switching signal generator 187, and a second switch 189. The inverter 181 may invert and buffer the first bit BK_ACT<1> of the bank active signal BK_ACT. The AND gate 183 may receive the output signal of the inverter 181 and a second bit D_BA<2> of the dummy bank address D_BA, and may generate a second dummy active signal DACT2 by performing an AND operation on the output signal and the second bit D_BA<2>. The second dummy active signal DACT2 may be deactivated when the first bit BK_ACT<1> of the bank active signal BK_ACT is activated. The second dummy active signal DACT2 may be activated in response to the second bit D_BA<2> of the dummy bank address D_BA in the state in which the first bit BK_ACT<1> of the bank active signal BK_ACT has been deactivated. The second pre-switching signal selector 185 may generate a second pre-switching signal PSW2 from the second bit BK_ACT<2> of the bank active signal BK_ACT and the second dummy active signal DACT2 based on the second bit BK_ACT<2> of the bank active signal BK_ACT. The second pre-switching signal selector 185 may output the second bit BK_ACT<2> of the bank active signal BK_ACT as the second pre-switching signal PSW2 when the second bit BK_ACT<2> of the bank active signal BK_ACT has a logic high level "1." The second pre-switching signal selector 185 may output the second dummy active signal DACT2 as the second pre-switching signal PSW2 when the second bit BK_ACT<2> of the bank active signal BK_ACT has a logic low level "0." The second switching signal generator 187 may generate a second switching signal SW2 from the second pre-switching signal PSW2 based on the second bit BK_STB<2> of the bank strobe BK_STB. The second switching signal generator 187 may generate the second switching signal SW2 by buffering the second pre-switching signal PSW2 when the second bit BK_STB<2> of the bank strobe BK_STB is activated. The second switch 189 may control the output of the second bit CDA<2> of the core data CDA based on the second switching signal SW2. The second switch 189 may be turned on when the second switching signal SW2 is activated, and may output the second bit CDA<2> of the core data CDA as the transmission data DATA through the data pad 190.

The second data control circuit 180 may generate the second pre-switching signal PSW2 and the second switching signal SW2 each activated to a logic high level in response to the second bit BK_ACT<2> of the bank active signal BK_ACT when a read operation for the second bank (157 in FIG. 6) is performed and the second bit BK_ACT<2> of the bank active signal BK_ACT is activated to a logic high level, and may output the second bit CDA<2> of the core data CDA as the transmission data DATA through the data pad 190. The second data control circuit 180 may generate the second pre-switching signal PSW2 and the second switching signal SW2 each deactivated to a logic low level in response to the second dummy active signal DACT2 deactivated to a logic low level when a read operation for the first bank (147 in FIG. 6) is performed and the first bit BK_ACT<1> of the bank active signal BK_ACT is activated to a logic high level, and may block the second bit CDA<2> of the core data CDA from being outputted through the data pad 190. The second data control circuit 180 may generate the second dummy active signal DACT2, the second pre-switching signal PSW2 and the second switching signal SW2 each activated to a logic high level whenever the second bit D_BA<2> of the dummy bank address D_BA is generated as a logic high level in the state in which the first and second bits BK_ACT<1:2> of the bank active signal BK_ACT have been deactivated to a logic low level because a read operation for the first bank (147 in FIG. 6) and the second bank (157 in FIG. 6) is not performed, and may output the second bit CDA<2> of the core data CDA as the transmission data DATA through the data pad 190.

FIGS. 8 to 15 are diagrams for describing an operation of the semiconductor device 13A according to an example of the present disclosure. FIGS. 8 to 11 are diagrams for describing an operation of the semiconductor device 13A performed when a read operation for the first bank 147 is performed. FIGS. 12 to 15 are diagrams for describing an operation of the semiconductor device 13A performed when a read operation for the first bank 147 and the second bank 157 is not performed.

First, an operation of the semiconductor device 13A performed when a read operation for the first bank 147 is performed is described as follows with reference to FIGS. 8 to 11.

Figure 8:
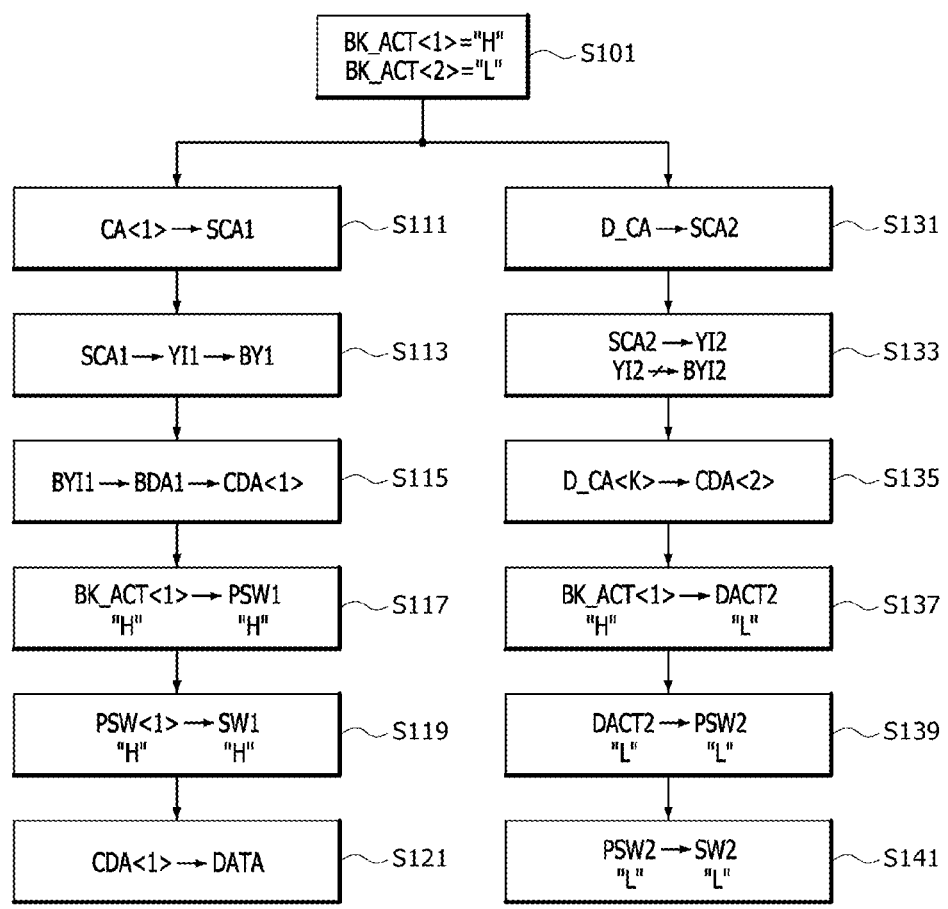
FIGS. 8 to 15 are diagrams for describing an operation of a semiconductor device according to an example of the present disclosure.

As illustrated in FIG. 8, when a read operation for the first bank 147 is performed, the first bit BK_ACT<1> of the bank active signal may be activated to a logic high level "H", and the second bit BK_ACT<2> of the bank active signal may be deactivated to a logic low level "L" (S101).

Figure 9:
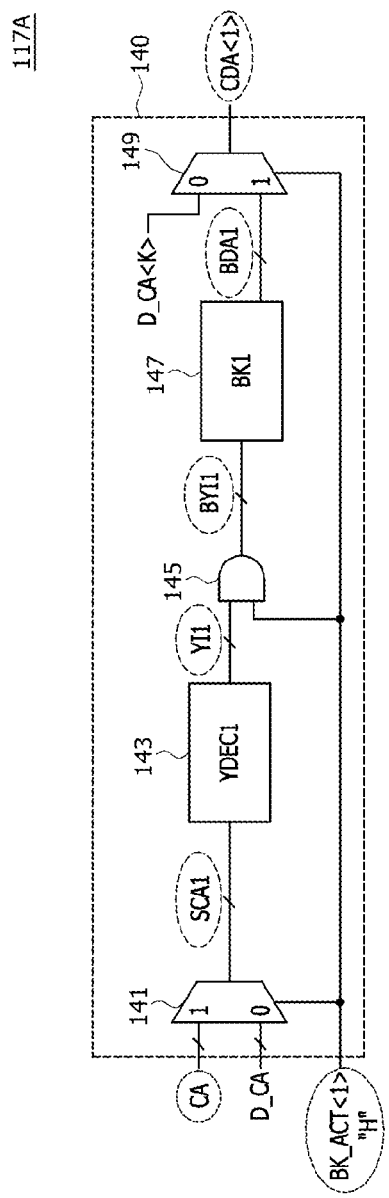

Referring to FIGS. 8 and 9, the column address CA may be selected as the first selection column address SCA1 by the first bit BK_ACT<1> of the bank active signal activated to the logic high level "H" (S111). In the state in which the first bit BK_ACT<1> of the bank active signal has been activated to the logic high level "H", the first selection column address SCA1 may be decoded, and the first column selection signal YI1 and the first bank column selection signal BY11 for selecting at least one of column lines (not illustrated) included in the first bank 147 may be sequentially generated (S113). The first bank data BDA1 may be outputted from a memory cell array (not illustrated) coupled to the column line (not illustrated) of the first bank 147 selected by the first bank column selection signal BY11. In the state in which the first bit BK_ACT<1> of the bank active signal has been activated to the logic high level "H", the first bank data BDA1 may be outputted as the first bit CDA<1> of the core data CDA (S115).

Figure 10:
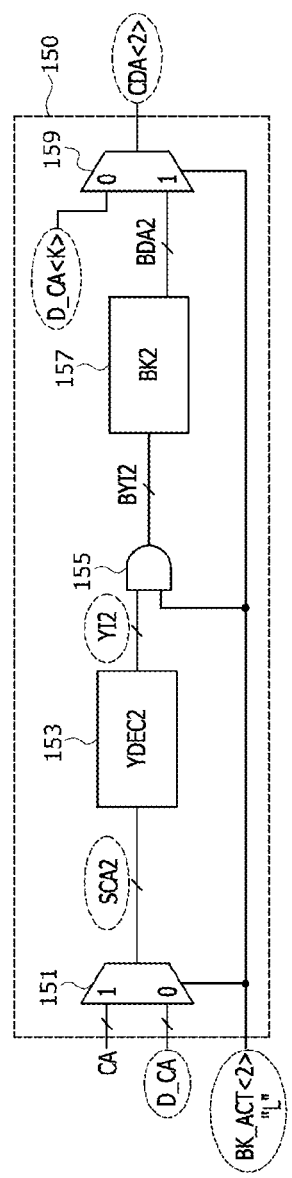

Referring to FIGS. 8 and 10, the dummy column address D_CA may be selected as the second selection column address SCA2 by the second bit BK_ACT<2> of the bank active signal deactivated to the logic low level "L" (S131). In the state in which the second bit BK_ACT<2> of the bank active signal has been deactivated to the logic low level "L", the second selection column address SCA2 is decoded and thus the second column selection signal YI2 is generated, but the second bank column selection signal BY12 is deactivated (S133). In the state in which the second bit BK_ACT<2> of the bank active signal has been deactivated to the logic low level "L", the K-th bit D_CA<K> of the dummy column address D_CA may be selected and outputted as the first bit CDA<2> of the core data CDA (S135). Even in the state in which a read operation for the second bank 157 is not performed, each of logic levels of internal nodes respectively included in the second input selector 151, the second column decoder 153 and the second output selector 159 is toggled, so the second input selector 151, the second column decoder 153, and the second output selector 159 can be prevented from deteriorating.

Figure 11:
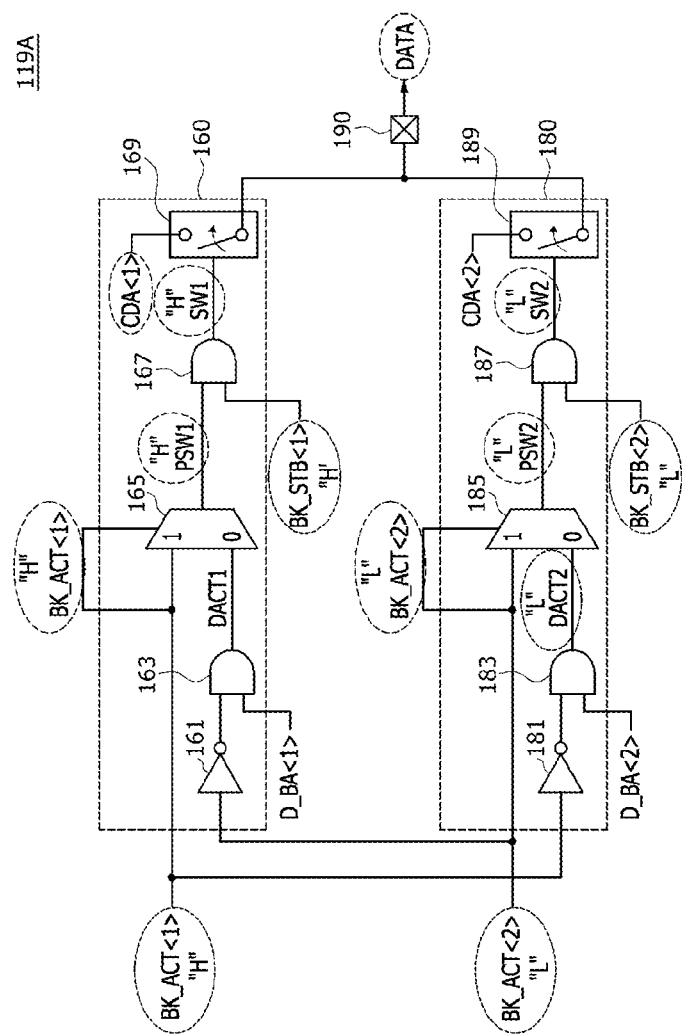

Referring to FIGS. 8 and 11, the first bit BK_ACT<1> of the bank active signal activated to the logic high level "H" may be selected and outputted as the first pre-switching signal PSW1 (S117). In the state in which the first bit BK_STB<1> of the bank strobe BK_STB has a logic high level "H", the first switching signal SW1 may be activated to a logic high level "H" by the first pre-switching signal PSW1 activated to the logic high level "H" (S119). The first bit CDA<1> of the core data CDA may be outputted as the transmission data DATA by the first switching signal SW1 activated to the logic high level "H." When the first bit BK_ACT<1> of the bank active signal BK_ACT is activated to a logic high level, the second dummy active signal DACT2 may be deactivated to a logic low level (S137). In the state in which the second bit BK_ACT<2> of the bank active signal BK_ACT has been deactivated to the logic low level "L", the second dummy active signal DACT2 deactivated to the logic low level may be selected and outputted as the second pre-switching signal PSW2 (S139). In the state in which the second bit BK_STB<2> of the bank strobe BK_STB has a logic low level "L", the second switching signal SW2 may be deactivated to a logic low level "L" by the second pre-switching signal PSW2 deactivated to the logic low level "L" (S141). The first switching signal SW1 deactivated to the logic low level "L" may block the second bit CDA<2> of the core data CDA from being outputted as the transmission data DATA."

An operation of the semiconductor device 13A performed when a read operation for the first bank 147 and the second bank 157 is not performed is described as follows with reference to FIGS. 12 to 15.

Figure 12:
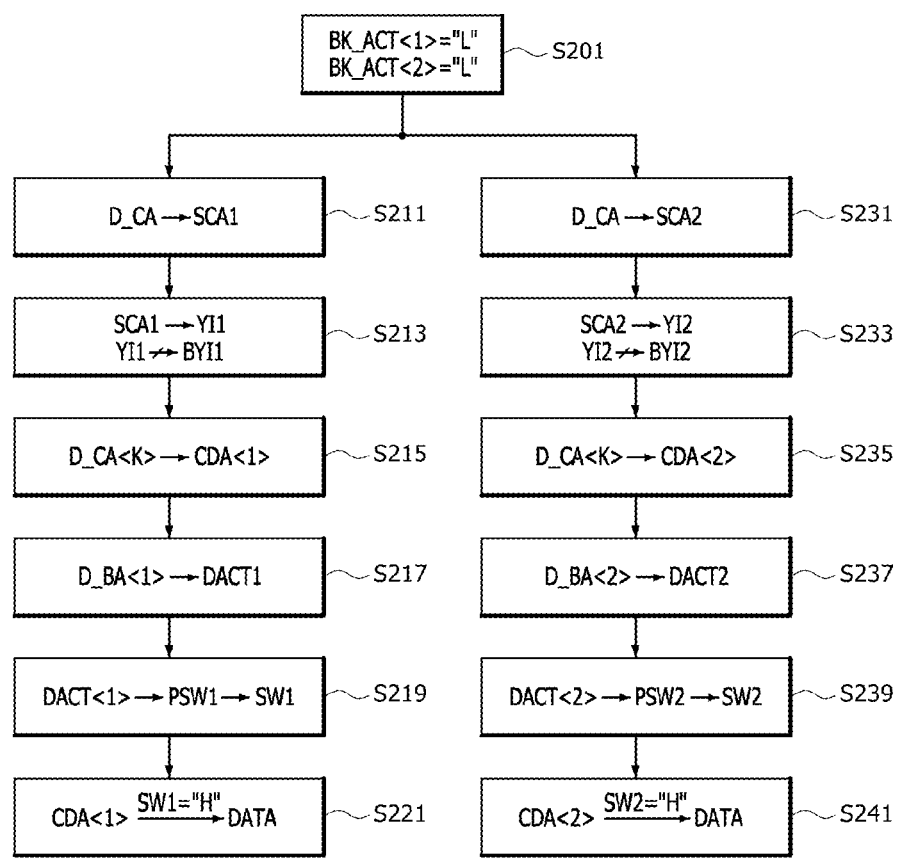

As illustrated in FIG. 12, when a read operation for the first bank 147 and the second bank 157 is not performed, the first bit BK_ACT<1> of the bank active signal and the second bit BK_ACT<2> of the bank active signal may both be deactivated to a logic low level "L" (S201).

Figure 13:
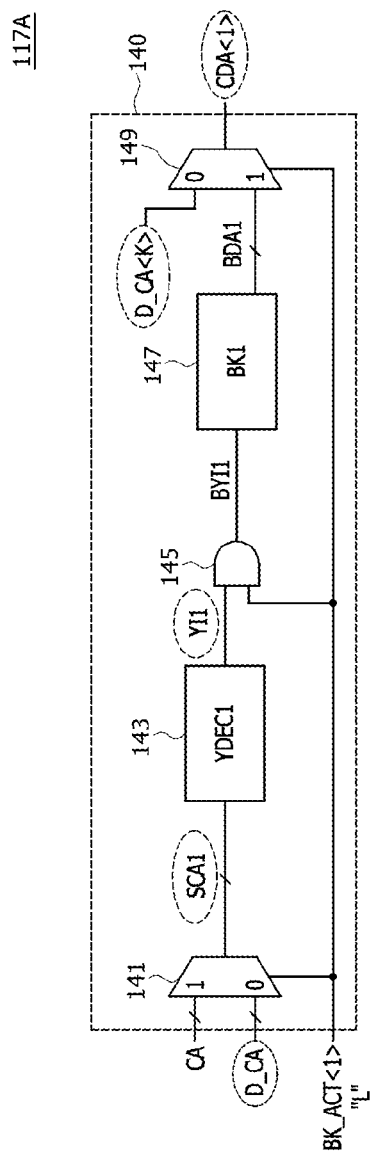

Referring to FIGS. 12 and 13, the dummy column address D_CA may be selected as the first selection column address SCA1 by the first bit BK_ACT<1> of the bank active signal deactivated to the logic low level "L" (S211). In the state in which the first bit BK_ACT<1> of the bank active signal has been deactivated to the logic low level "L", the first selection column address SCA1 is decoded and thus the first column selection signal YI1 is generated, but the first bank column selection signal BY11 is deactivated (S213). In the state in which the first bit BK_ACT<1> of the bank active signal has been deactivated to the logic low level "L", the K-th bit D_CA<K> of the dummy column address D_CA may be selected and outputted as the first bit CDA<1> of the core data CDA (S215). Even in the state in which a read operation for the first bank 147 is not performed, each of logic levels of internal nodes respectively included in the first input selector 141, the first column decoder 143, and the first output selector 149 is toggled, so the first input selector 141, the first column decoder 143, and the first output selector 149 can be prevented from deteriorating.

Figure 14:
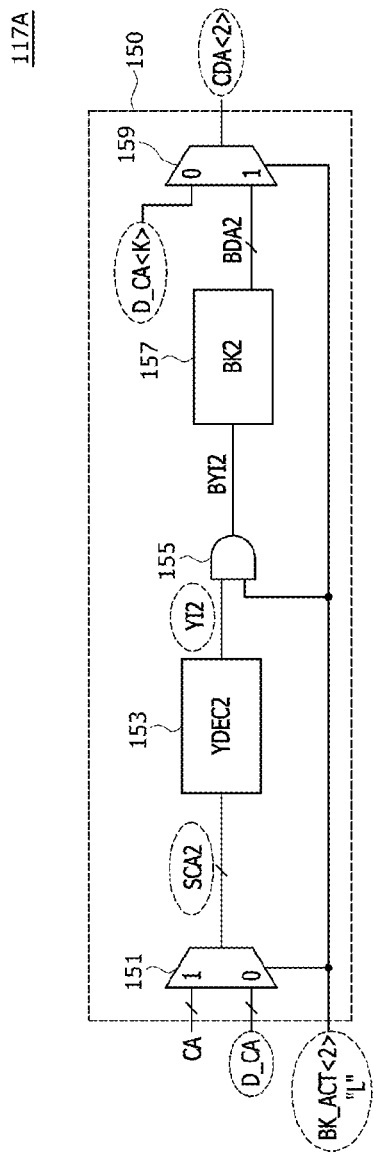

Referring to FIGS. 12 and 14, the dummy column address D_CA may be selected as the second selection column address SCA2 by the second bit BK_ACT<2> of the bank active signal deactivated to the logic low level "L" (S231).

In the state in which the second bit BK_ACT<2> of the bank active signal has been deactivated to the logic low level "L", the second selection column address SCA2 is decoded and thus the second column selection signal YI2 is generated, but the second bank column selection signal BYI2 is deactivated (S233). In the state in which the second bit BK_ACT<2> of the bank active signal has been deactivated to the logic low level "L", the K-th bit D_CA<K> of the dummy column address D_CA may be selected and outputted as the second bit CDA<2> of the core data CDA (S235). Even in the state in which a read operation for the second bank 157 is not performed, each of logic levels of internal nodes respectively included in the second input selector 151, the second column decoder 153, and the second output selector 159 is toggled, so the second input selector 151, the second column decoder 153, and the second output selector 159 can be prevented from deteriorating.

Figure 15:
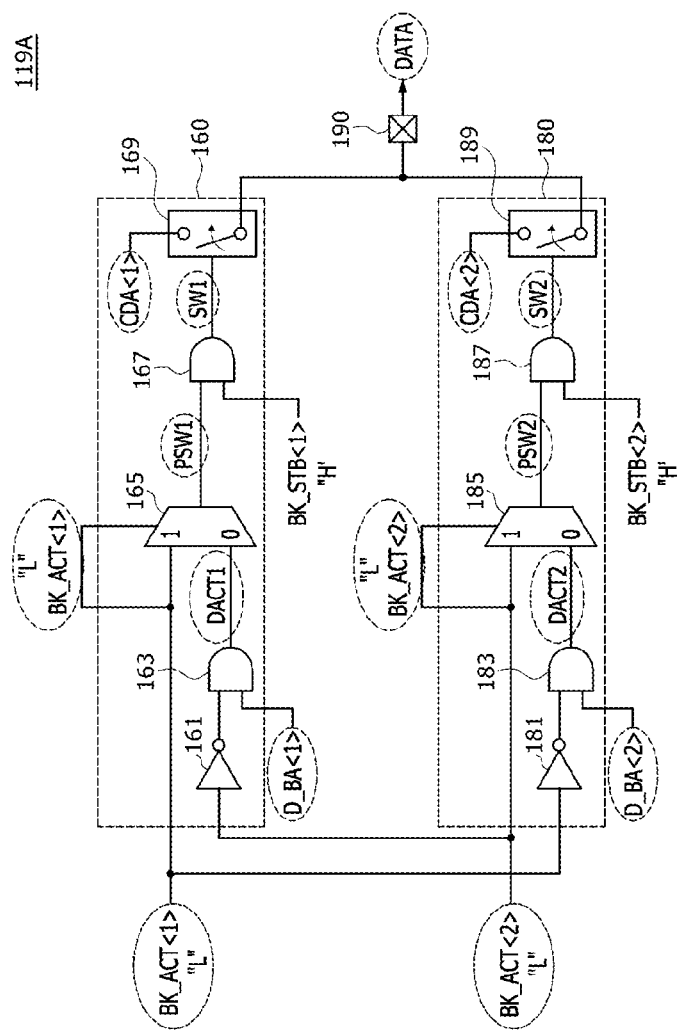

Referring to FIGS. 12 and 15, when the second bit BK_ACT<2> of the bank active signal BK_ACT is deactivated to the logic low level "L", the first dummy active signal DACT1 may be generated based on the first bit D_BA<1> of the dummy bank address D_BA (S217). The first dummy active signal DACT1 may be activated to a logic high level when the first bit D_BA<1> of the dummy bank address D_BA has a logic high level. In the state in which the first bit BK_ACT<1> of the bank active signal BK_ACT is deactivated to the logic low level "L" and the first bit BK_STB<1> of the bank strobe BK_STB has a logic high level "H", when the first bit D_BA<1> of the dummy bank address D_BA has a logic high level "H", the first pre-switching signal PSW1 and the first switching signal SW1 may be sequentially activated to a logic high level (S219). When the first switching signal SW1 is activated to the logic high level "H" by the first bit D_BA<1> of the dummy bank address D_BA, the first bit CDA<1> of the core data CDA may be outputted as the transmission data DATA (S221). Even in the state in which a read operation for the first bank 147 is not performed, each of logic levels of internal nodes respectively included in the inverter 161, the AND gate 163, the first pre-switching signal selector 165, the first switching signal generator 167, and the first switch 169 is toggled, so the inverter 161, the AND gate 163, the first pre-switching signal selector 165, the first switching signal generator 167, and the first switch 169 can be prevented from deteriorating.

Referring to FIGS. 12 and 15, when the first bit BK_ACT<1> of the bank active signal BK_ACT is deactivated to the logic low level "L", the second dummy active signal DACT2 may be generated based on the second bit D_BA<2> of the dummy bank address D_BA (S237). The second dummy active signal DACT2 may be activated to a logic high level when the second bit D_BA<2> of the dummy bank address D_BA has a logic high level. In the state in which the second bit BK_ACT<2> of the bank active signal BK_ACT is deactivated to the logic low level "L" and the second bit BK_STB<2> of the bank strobe BK_STB has a logic high level "H", when the second bit D_BA<2> of the dummy bank address D_BA has the logic high level "H", the second pre-switching signal PSW2 and the second switching signal SW2 may be sequentially activated to a logic high level (S239). When the second switching signal SW2 is activated to the logic high level "H" by the second bit D_BA<2> of the dummy bank address D_BA, the second bit CDA<2> of the core data CDA may be outputted as the transmission data DATA (S241). Even in the state in which a read operation for the second bank 157 is not performed, each of logic levels of internal nodes respectively included in the inverter 181, the AND gate 183, the second pre-switching signal selector 185, the second switching signal generator 187, and the second switch 189 is toggled, so the inverter 181, the AND gate 183, the second pre-switching signal selector 185, the second switching signal generator 187, and the second switch 189 can be prevented from being deteriorated.

Figure 16:
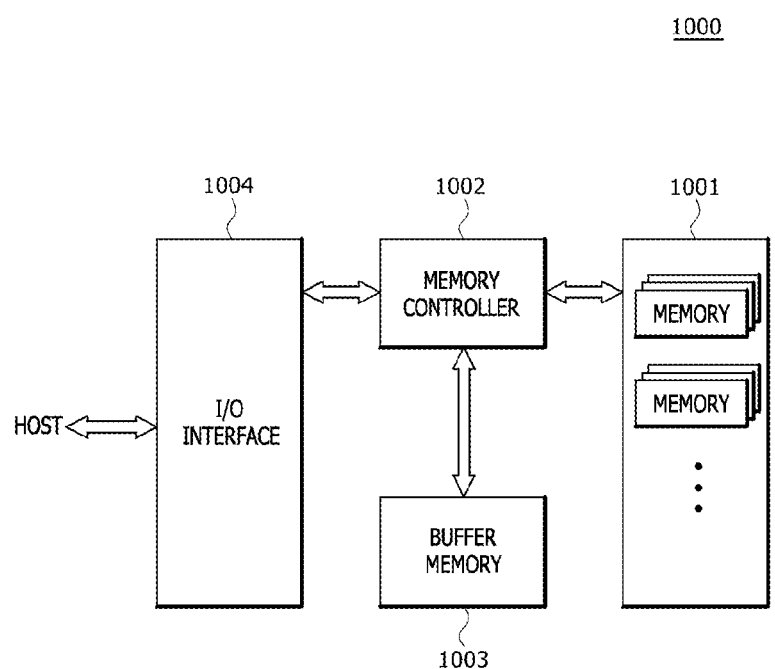
FIG. 16 is a block diagram illustrating a configuration of an electronic system according to an example of the present disclosure.

The semiconductor device 13 described above with reference to FIG. 1 and the semiconductor device 13A described above with reference to FIG. 2 may be applied to a memory system, a graphic system, a computing system, an electronic system including a mobile system, etc. For example, referring to FIG. 16, an electronic system 1000 according to an embodiment of the present disclosure may include a data storage unit 1001, a memory controller 1002, a buffer memory 1003, and an input and output interface 1004.

The data storage unit 1001 may store data applied from the memory controller 1002 in response to a control signal from the memory controller 1002, may read the stored data, and may output the read data to the memory controller 1002. The data storage unit 1001 may include the semiconductor device 13 described with reference to FIG. 1 or the semiconductor device 13A described with reference to FIG. 2. The data storage unit 1001 may include a nonvolatile memory capable of continuing to store data without losing the data although power to the nonvolatile memory is blocked. The nonvolatile memory may be implemented as flash memory (e.g., NOR flash memory or NAND flash memory), phase change random access memory (PRAM), resistive random access memory (RRAM), spin transfer torque random access memory (STTRAM), or magnetic random access memory (MRAM).

The memory controller 1002 may decode a command applied from an external device (e.g., a host) through the input and output interface 1004, and may control a data input and output for the data storage unit 1001 and the buffer memory 1003 based on the decoded result. Although the memory controller 1002 has been illustrated as one block in FIG. 16, a controller for controlling the data storage unit 1001 and a controller for controlling the buffer memory 1003, that is, a volatile memory, may be independently configured in the memory controller 1002. The memory controller 1002 may include the controller 11 described with reference to FIG. 1.

The buffer memory 1003 may temporarily store data to be processed in the memory controller 1002, that is, data inputted to and outputted from the data storage unit 1001. The buffer memory 1003 may store data DATA applied from the memory controller 1002 in response to a control signal. The buffer memory 1003 may read the stored data and output the read data to the memory controller 1002. Example of the buffer memory 1003 may include volatile memory, such as dynamic random access memory (DRAM), mobile DRAM, and static random access memory (SRAM).

The input and output interface 1004 may provide a physical connection between the memory controller 1002 and the external device (host), so that the memory controller 1002 can receive a control signal for a data input and output from the external device and exchange data with the external device. The input and output interface 1004 may include one of various interface protocols, such as a USB, MMC, PCI-E, SAS, SATA, PATA, an SCSI, an ESDI, and IDE.

The electronic system 1000 may be used as an auxiliary storage device of a host or an external storage device. Examples of the electronic system 1000 may include a solid state disk (SSD), a universal serial bus memory (USB memory), a secure digital (SD) card, a mini secure digital (mSD) card, a micro SD card, a secure digital high capacity (SDHC), a memory stick card, a smart media (SM) card, a multi-media card (MMC), an embedded MMC (eMMC), a compact flash (CF), etc.

Figure 17:
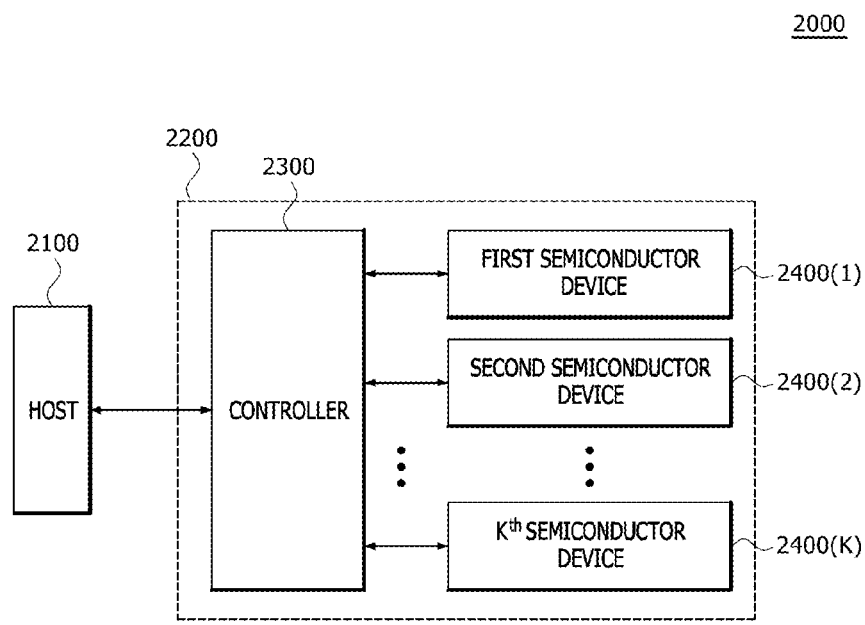
FIG. 17 is a block diagram illustrating a configuration of an electronic system according to another example of the present disclosure.

FIG. 17 is a block diagram illustrating a configuration of an electronic system 2000 according to another example of the present disclosure. As illustrated in FIG. 17, the electronic system 2000 may include a host 2100 and a semiconductor system 2200.

The host 2100 and the semiconductor system 2200 may transmit signals to each other by using an interface protocol. Examples of the interface protocol used between the host 2100 and the semiconductor system 2200 may include a multi-media card (MMC), an enhanced small disk interface (ESDI), integrated drive electronics (IDE), peripheral component interconnect-express (PCI-E), advanced technology attachment (ATA), serial ATA (SATA), parallel ATA (PATA), a serial attached SCSI (SAS), a universal serial bus (USB), etc.

The semiconductor system 2200 may include a controller 2300 and semiconductor devices 2400(K:1). The controller 2300 may control the semiconductor devices 2400(K:1) so that the semiconductor devices 2400(K:1) perform an active operation, a read operation, and a write operation. Each of the semiconductor devices 2400(K:1) may toggle each of logic levels of internal nodes respectively included in the internal circuits (141, 143, 149, 151, 153, and 159 in FIG. 6) in response to the dummy column address D_CA when a column operation for the first bank (147 in FIG. 6) and the second bank (157 in FIG. 6) is not performed, thereby preventing the internal circuits (141, 143, 149, 151, 153, and 159 in FIG. 6) from deteriorating. Each of the semiconductor devices 2400(K:1) may toggle each of logic levels of internal nodes respectively included in the internal circuits (161, 163, 165, 167, 169, 181, 183, 185, 187, and 189 in FIG. 7) in response to the dummy bank address D_BA when a column operation for the first bank (147 in FIG. 6) and the second bank (157 in FIG. 6) is not performed, thereby preventing the internal circuits (161, 163, 165, 167, 169, 181, 183, 185, 187, and 189 in FIG. 7) from deteriorating.

The controller 2300 may be implemented as the controller 11 described with reference to FIG. 1. Each of the semiconductor devices 2400(K:1) may be implemented as the semiconductor device 13 described with reference to FIG. 1 or the semiconductor device 13A described with reference to FIG. 2. Each of the semiconductor devices 2400(K:1) may be implemented with one of dynamic random access memory (DRAM), phase change random access memory (PRAM), resistive random access memory (RRAM), magnetic random access memory (MRAM), and ferroelectric random access memory (FRAM).

Some embodiments of the present disclosure have been described. A person having common knowledge in a technical field to which the present teachings pertains will understand that the present teachings may be implemented in a modified form without departing from an intrinsic characteristic of the present disclosure. Accordingly, the disclosed embodiments should be considered from a descriptive viewpoint, not from a limitative viewpoint. The range of the present disclosure is described in the claims, not the above description, and all differences within an equivalent range thereof should be construed as being included in the present disclosure.

What is claimed is:

1. A semiconductor device comprising:
a memory core circuit configured to generate core data from bank data outputted by a bank or generate the core data from a dummy column address based on a read operation for the bank; and
a data control circuit configured to:
generate a switching signal from a bank active signal or a dummy bank address based on the read operation for the bank, and
control the output of the core data based on the switching signal,
wherein the core data based on the dummy column address when the read operation is not performed for the bank.

2. The semiconductor device of claim 1, wherein:
the bank comprises a first bank and a second bank,
the bank data comprises first bank data and second bank data, and
the memory core circuit comprises a first memory core circuit configured to generate the core data based on the first bank data outputted by the first bank when the read operation is performed for the first bank.

3. The semiconductor device of claim 2, wherein the first memory core circuit comprises:
an input selector configured to generate a selection column address from a column address or the dummy column address based on the bank active signal;
a column decoder configured to generate a column selection signal for selecting a column line included in the first bank by decoding the selection column address;
the first bank configured to output the first bank data in response to a bank column selection signal generated from the column selection signal based on the bank active signal; and
an output selector configured to generate the core data from the first bank data or the dummy column address based on the bank active signal.

4. The semiconductor device of claim 2, wherein the memory core circuit further comprises a second memory core circuit, wherein the second memory core circuit is configured to:
generate the core data based on the second bank data outputted by the second bank when the read operation is performed for the second bank, and
generate the core data based on the dummy column address when the read operation is not performed for the second bank.

5. The semiconductor device of claim 1, wherein:
the bank comprises a first bank and a second bank,
the switching signal comprises a first switching signal and a second switching signal, and
the data control circuit comprises a first data control circuit configured to generate the first switching signal activated to output the core data generated from the first bank when the read operation is performed for the first bank.

6. The semiconductor device of claim 5, wherein the first data control circuit is configured to generate the first switching signal deactivated when the read operation is performed for the second bank.

7. The semiconductor device of claim 5, wherein the first data control circuit is configured to generate the first switching signal from the dummy bank address when the read operation is not performed for the first bank and the second bank.

8. The semiconductor device of claim 5, wherein the first data control circuit comprises:
  a pre-switching signal selector configured to generate a first pre-switching signal from the bank active signal or the dummy bank address based on the bank active signal;
  a switching signal generator configured to generate the first switching signal from the first pre-switching signal based on a bank strobe; and
  a switch configured to be turned on to output the core data as transmission data through a data pad based on the first switching signal.

9. The semiconductor device of claim 5, wherein the data control circuit further comprises a second data control circuit, wherein the second data control circuit is configured to generate the second switching signal activated to output the core data generated from the second bank when the read operation is performed for the second bank.

10. The semiconductor device of claim 9, wherein the second data control circuit is configured to:
  generate the second switching signal deactivated when the read operation for the first bank is performed, and
  generate the second switching signal from the dummy bank address when the read operation is not performed for the first bank and the second bank.

11. The semiconductor device of claim 1, further comprising a bank control circuit configured to generate the bank active signal and a bank strobe based on a column operation for the bank.

12. The semiconductor device of claim 11, wherein:
  the bank comprises a first bank and a second bank, and the bank control circuit is configured to:
    activate a first bit of the bank active signal when the read operation is performed for the first bank, and
    activate a second bit of the bank active signal when the read operation is performed for the second bank.

13. The semiconductor device of claim 11, wherein:
  the bank comprises a first bank and a second bank, and the bank control circuit is configured to:
    activate a first bit of the bank strobe when the read operation is performed for the first bank,
    activate a second bit of the bank strobe when the read operation is performed for the second bank, and
    generate the bank strobe from the dummy column strobe when the read operation is not performed for the first bank and the second bank.

14. The semiconductor device of claim 11, wherein the bank control circuit is configured to:
  apply the bank active signal to the memory core circuit and the data control circuit, and
  apply the bank strobe to the data control circuit.

15. The semiconductor device of claim 1, further comprising a dummy control circuit configured to generate a dummy column strobe, the dummy column address, and the dummy bank address.

16. The semiconductor device of claim 15, wherein the dummy control circuit is configured to:
  generate the dummy column address by counting a pulse of the dummy column strobe, and
  generate the dummy bank address based on at least one of logic levels of bits included in the dummy column address.

17. A semiconductor device comprising:
  a first memory core circuit configured to generate core data from first bank data outputted by a first bank or generate the core data from a dummy column address based on a read operation for the first bank; and
  a second memory core circuit configured to generate the core data from second bank data outputted by a second bank or generate the core data from the dummy column address based on a read operation for the second bank,
  wherein the core data based on the dummy column address when the read operation is not performed for the first bank.

18. The semiconductor device of claim 17, wherein the first memory core circuit comprises:
  an input selector configured to generate a selection column address from a column address or the dummy column address based on a bank active signal;
  a column decoder configured to generate a column selection signal for selecting a column line included in the first bank by decoding the selection column address;
  the first bank configured to output the first bank data in response to a bank column selection signal generated from the column selection signal based on the bank active signal; and
  an output selector configured to generate the core data from the first bank data or the dummy column address based on the bank active signal.

19. The semiconductor device of claim 17, further comprising a first data control circuit configured to generate a first switching signal activated to output the core data generated from the first bank when the read operation for the first bank is performed.

20. The semiconductor device of claim 18, wherein the first data control circuit is configured to:
  generate a first switching signal deactivated when the read operation for the second bank is performed, and
  generate the first switching signal from a dummy bank address when a read operation for the first bank and the second bank is not performed.

21. The semiconductor device of claim 18, wherein the first data control circuit comprises:
  a pre-switching signal selector configured to generate a first pre-switching signal from the bank active signal or a dummy bank address based on the bank active signal;
  a switching signal generator configured to generate a first switching signal from the first pre-switching signal based on a bank strobe; and
  a switch turned on to output the core data as transmission data through a data pad based on the first switching signal.

22. The semiconductor device of claim 19, further comprising a second data control circuit configured to generate a second switching signal activated to output the core data generated from the second bank when the read operation for the second bank is performed.

23. The semiconductor device of claim 22, wherein the second data control circuit is configured to:
  generate the second switching signal deactivated when the read operation for the first bank is performed, and
  generate the second switching signal from a dummy bank address when a read operation for the first bank and the second bank is not performed.

24. A semiconductor device comprising:
  a first data control circuit configured to generate a first switching signal activated to output core data generated from a first bank when a read operation for the first bank is performed; and
  a second data control circuit configured to generate a second switching signal activated to output the core data generated from a second bank when a read operation for the second bank is performed, wherein the core data based on the dummy column address when the read operation is not performed for the first bank.

25. The semiconductor device of claim 24, wherein the first data control circuit is configured to:
generate the first switching signal deactivated when the read operation for the second bank is performed, and
generate the first switching signal from a dummy bank address when a read operation for the first bank and the second bank is not performed.

26. The semiconductor device of claim 24, wherein the first data control circuit comprises:
a pre-switching signal selector configured to generate a first pre-switching signal from a bank active signal or a dummy bank address based on the bank active signal;
a switching signal generator configured to generate the first switching signal from the first pre-switching signal based on a bank strobe; and
a switch turned on to output the core data as transmission data through a data pad based on the first switching signal.

27. The semiconductor device of claim 24, wherein the second data control circuit is configured to:
generate the second switching signal deactivated when the read operation for the first bank is performed, and
generate the second switching signal from a dummy bank address when a read operation for the first bank and the second bank is not performed.

* * * * *